United States Patent
Ohashi et al.

(10) Patent No.: US 8,532,818 B2
(45) Date of Patent: Sep. 10, 2013

(54) VACUUM CHAMBER

(75) Inventors: Tomohiro Ohashi, Shunan (JP);
Tsutomu Nakamura, Hikari (JP);
Hidenobu Tanimura, Kudamatsu (JP);
Michiaki Kobayashi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 684 days.

(21) Appl. No.: 12/712,861

(22) Filed: Feb. 25, 2010

(65) Prior Publication Data

US 2011/0137454 A1 Jun. 9, 2011

(30) Foreign Application Priority Data

Dec. 9, 2009 (JP) .................................. 2009-279036

(51) Int. Cl.
*G06F 7/00* (2006.01)
(52) U.S. Cl.
USPC .......................................... 700/228; 700/214
(58) Field of Classification Search
USPC ................................................ 700/214, 228
See application file for complete search history.

(56) References Cited

U.S. PATENT DOCUMENTS

| | | | |
|---|---|---|---|
| 2008/0051929 A1* | 2/2008 | Hongkham et al. | 700/214 |
| 2008/0051930 A1* | 2/2008 | Oh et al. | 700/214 |
| 2009/0259335 A1* | 10/2009 | Ikeda et al. | 700/228 |

FOREIGN PATENT DOCUMENTS

JP 10-173022 6/1998

* cited by examiner

*Primary Examiner* — Ramya Burgess
(74) *Attorney, Agent, or Firm* — Antonelli, Terry, Stout & Kraus, LLP.

(57) ABSTRACT

A vacuum chamber includes: a vacuum vessel arranged at the backward side, where a wafer of a processing subject is processed inside an internal processing chamber; a transfer chamber arranged at the forward side, where said wafer is transferred at the inside thereof under atmospheric pressure; a cassette stage arranged at the forward of this transfer chamber, where a cassette storing said wafer is mounted; a lock chamber connected with said transfer chamber at the backward of said transfer chamber; a robot arranged inside said transfer chamber, where said wafer is transferred between said cassette and said lock chamber; and an aligning machine for making position of said wafer fit with the predetermined position, wherein the wafer is transferred to said lock chamber, after performing alignment of said wafer on said aligning machine, in the case where displacement amount of position of this wafer is larger than the predetermined value.

6 Claims, 4 Drawing Sheets

FLOOR SURFACE

VACUUM CHAMBER

BACKGROUND OF THE INVENTION

The present invention relates to a vacuum chamber provided with a vacuum vessel containing inside a processing chamber, where a substrate-like sample such as a semiconductor wafer is processed in a reduced pressure state, and particularly the present invention relates to one provided with a transfer unit for transferring the sample under atmospheric pressure, and a unit for making this sample fit with the predetermined position.

The vacuum chamber such as the above is one for processing a sample by reducing pressure of a processing chamber arranged inside the vacuum vessel to the predetermined vacuum degree. In such a chamber, in general, a sample such as a wafer is transferred to the processing chamber piece by piece, therefore there is connected a transfer vessel in which the wafer is transferred the inside of a transfer chamber, whose inside is depressurized similarly, in communication with the vacuum vessel, as well as there is arranged with a transfer machine for transferring the sample at the inside of a transfer chamber, for example, a robot having an arm for transfer.

In addition, in such a chamber, the sample is stored in a cassette under atmosphere nearly adjusted to atmospheric pressure, and carried to the vacuum chamber, and the sample is transferred between the processing chamber and the cassette, in a state installed and connected in this chamber. Therefore, a transfer machine (the robot) for transferring the sample is arranged at each of a region in the chamber set to the predetermined vacuum degree, and a region set to atmospheric pressure.

Further, between the vacuum region containing the above vacuum transfer chamber where the sample is transferred under vacuum, and the region where the sample is transferred under atmospheric pressure, there is a unit called a lock chamber for adjusting pressure of inside the by pressurization or depressurization, between atmospheric pressure and pressure of the predetermined vacuum degree, by connecting these. This lock chamber is a space inside a vessel where pressure is changed by sealing, after carrying-in or carrying-out the sample stored in the inside in each of a state under atmospheric pressure and a state under vacuum. That is, the lock chamber is an interface to connect the region of the vacuum side and the region of the atmospheric side.

Incidentally, it is required that the transfer robot (atmospheric transfer robot) at the region of the atmospheric side steers the sample toward a specific direction for processing inside the processing chamber, when the sample is taken out from the inside of the cassette, transferred to the processing chamber, and subjected to processing. For example, in the case of cutting out a semiconductor device from a semiconductor wafer after completion of the processing, it is necessary to perform the cutting along a direction of specific crystal of the semiconductor. One of the reasons for this is because the case of cutting out in a direction not along the crystal direction results in generation of damage or crack in the semiconductor device, and decrease in yield.

Therefore, in a conventional vacuum chamber, there is provided with a unit for alignment of a sample in a specific direction. For example, there has been performed formation of a notched part at the predetermined outer edge part of a circular sample, in advance, and detection of the notched part of the sample, by an alignment unit, before the sample taken out from the cassette is carried into the lock chamber, as well as alignment of the sample in a specific direction by rotating the sample. By detection of V-notch position by performing alignment about a plurality of samples in this specific direction, in the alignment unit, and by performing alignment, persistent processing results can be obtained and reproducibility of sample processing can be enhanced.

In such an alignment unit, eccentricity and position of a specific part of the sample, which is transferred and mounted on the unit, are detected; size of eccentricity of the center and position of the notched part are detected with a specific sensor, for example, a laser-type line sensor or the like, by rotating the sample; the notched part is steered in a specific direction by rotating the sample; as well as the sample is moved in a horizontal direction and center eccentricity is corrected. In this way, in the alignment unit, detection and adjustment of eccentricity of the sample and the specific direction are performed.

Further, there is known such one that detects size of eccentricity of a sample in the alignment unit, and adjusts position of a transfer robot based on this, and eccentricity is corrected, in receiving the sample from the alignment unit. As an example of such conventional technology, there is known one disclosed in JP-A-10-173022. In this present conventional technology, the alignment unit only steers the sample in a specific direction by detecting position of the notched part, and by rotating the sample, and adjustment of eccentricity is adjusted in receiving the sample by entering a robot arm downward of the sample which is retained on the alignment unit.

SUMMARY OF THE INVENTION

However, in the above conventional technology, consideration on the following points is insufficient, thus problems have been generated.

That is, in delivery or transfer of the sample by the robot, there may be the case where the sample is retained at position displaced with a distance apart from the predetermined position, therefore it could not attain precise aligning and mounting at the objective position of a transfer destiny.

That is, in delivery of the sample, there may be raised a problem of displacement generation between the sample and the predetermined position on a hand, which has a surface for mounting and retaining the sample at a robot arm or at the tip side thereof; or a problem of movement of position of the sample on these robot arms or hands, during transfer. For example, even when the sample is uplifted by a pusher pin, and the robot arm is controlled the action, the hand at the arm tip side is arranged at the predetermined position downward the sample, in the case where position where the sample is mounted is different from the standard position in mounting the sample on the arm or the hand, the above displacement could be generated.

Such variation of sample position makes unstable adsorption or retaining of the sample to the sample mounting surface at an objective place such as the sample stage inside the processing chamber, resulting in generation of non-uniform adsorption force to retain the sample, or non-uniform processing, and decrease in yield of processing. In addition, the sample can not be mounted stably on the arm or the hand in delivery thereof, resulting in dropping of the sample during transfer, or generation of accidents or contaminations due to contact with surface of the chamber inside.

Low transfer precision of the sample by the robot gives a bad effect to processing performance in processing the sample inside the processing chamber. It is required, in order to suppress this, that positions of the sample and the hand are arranged in high precision to the delivery position of the sample, so as to succeed sure delivery, even when allowable displacement value of positions of the sample and the hand is small, in receiving the sample by the robot.

On the other hand, at the inside of the cassette, where the sample is stored, transferred to the chamber and placed, position of the sample is not determined in high precision. In this case, when the robot transfers the sample from the storing cassette, there could generate displacement of sample transfer position relative to target transfer position by each sample. Therefore, when the robot for transferring the sample to the processing chamber receives the sample, if the allowable displacement amount of the robot hand and the sample position is small, there may be unsuccessful sample delivery.

Then, when the robot transfers the sample from the cassette at atmospheric pressure side, it becomes necessary to correct the above position displacement of the sample at the alignment unit. On the other hand, because detection of dislocation of sample position, for example, size of eccentricity and position of a specific place (for example, a notched part) is performed by the alignment unit on the way of transfer, transfer of the sample from the cassette toward the processing chamber leads to longer transfer time, because transfer is necessary to be performed via the alignment unit.

It is an object of the present invention to provide a vacuum chamber providing shortened time required for sample transfer, and having enhanced processing efficiency.

The above object is attained by a vacuum chamber provided with: a vacuum vessel arranged at the backward side, where a wafer of a processing subject is processed inside an internal processing chamber; a transfer chamber arranged at the forward side, where said wafer is transferred at the inside thereof under atmospheric pressure; a cassette stage arranged at the forward of this transfer chamber, where a cassette storing said wafer is mounted; a lock chamber connected with said transfer chamber at the backward of said transfer chamber; a robot arranged inside said transfer chamber, where said wafer is transferred between said cassette and said lock chamber; and an aligning machine for making position of said wafer fit with the predetermined position; wherein the wafer is transferred to said lock chamber, after performing alignment of said wafer on said aligning machine, in the case where displacement amount of position of this wafer is larger than the predetermined value, in taking out said wafer from said cassette to the inside of the transfer chamber by said robot.

Further, the above object is attained by that the robot corrects the displacement amount of position before mounting the wafer on a stage inside the lock chamber, in the case where the displacement amount of position by the detector is equal to or smaller than the predetermined value.

Further, the above object is attained by that the detector is one for detecting displacements of position of a notched part and center position of the wafer, and the aligning machine corrects at least any one of the displacement amounts of these positions.

Further, the above object is attained by that the robot performs correction of the displacement amounts of position in a state that the robot is positioned on the aligning machine.

Other objects, features and advantages of the invention will become apparent from the following description of the embodiments of the invention taken in conjunction with the accompanying drawings.

DETAILED DESCRIPTION OF THE INVENTION

Explanation will be given below in detail on embodiments of the present invention, with reference to drawings.

Explanation will be given below on one embodiment of the present invention, with reference to FIGS. 1 to 6.

Figure 1:
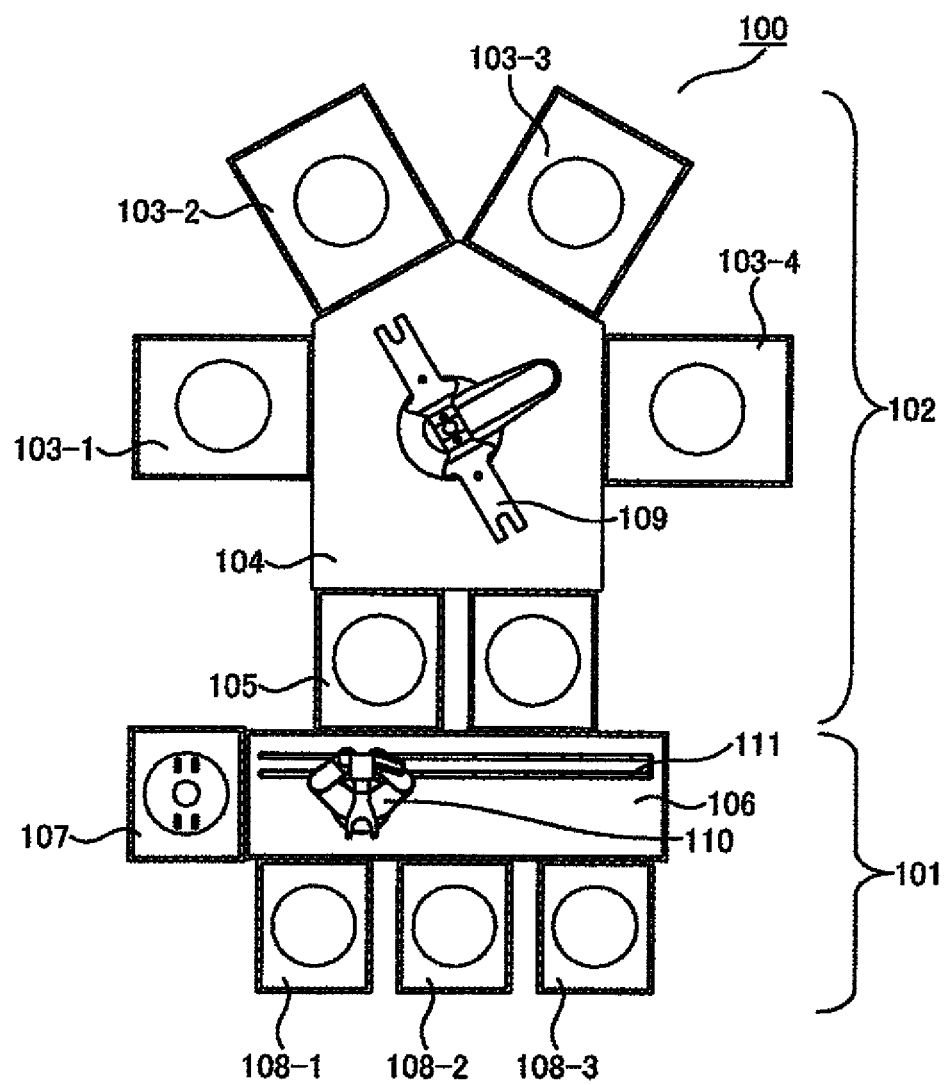
FIG. 1 is a drawing for explaining outline of a configuration of the vacuum chamber relevant to the embodiment of the present invention.
Figure 2:
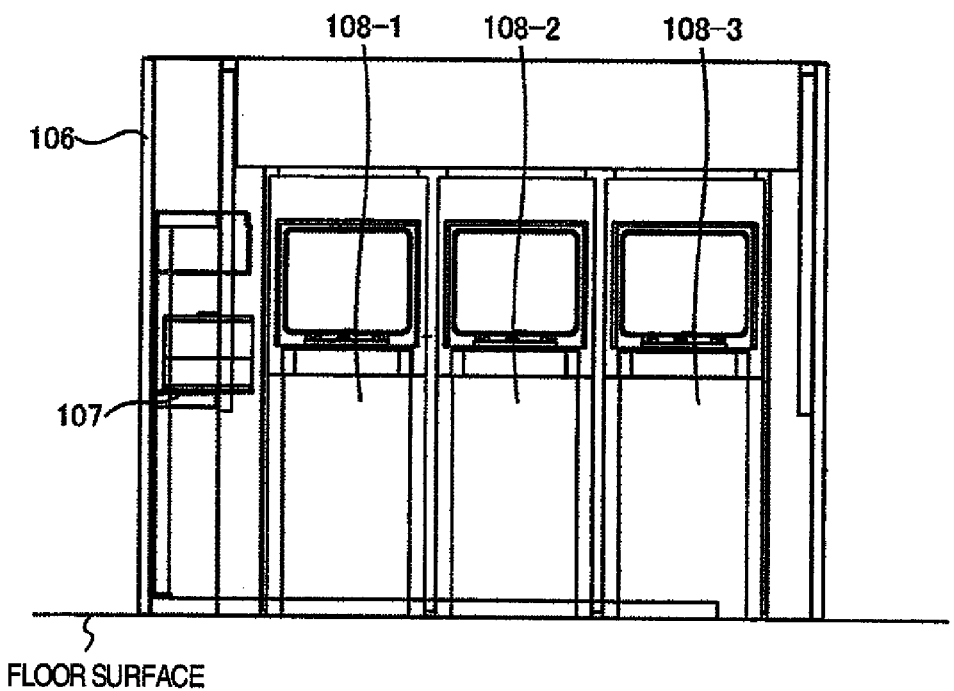
FIG. 2 is a front view of the embodiment shown in FIG. 1.

FIG. 1 is a top cross-sectional view for explaining a total configuration of the vacuum chamber relevant to the embodiment of the present invention. FIG. 2 is a front view of the embodiment shown in FIG. 1.

A vacuum chamber 100 is largely divided to front and back two parts: an atmospheric block 101 and a processing block 102. The atmospheric block 101 is a part where a substrate-like sample, such as a semiconductor wafer, is transferred under atmospheric pressure so as to perform positioning or the like; and the processing block 102 is a part where the wafer is transferred under pressure reduced from atmospheric pressure for processing or the like, and pressure is decreased or increased in a state that the wafer is mounted.

The atmospheric block 101 has a housing 106 provided with an atmospheric transfer robot 110 at the inside thereof, and is provided with cassette stage 108-1, 108-2 and 108-3, mounted with the cassette 108, which processing subject attached on this housing 106 or a wafer for cleaning use is stored. Further, the atmospheric transfer robot 110 moves on a rail 111, which extends along a lateral (left and right) direction, where the cassettes 108-1 to 108-3 are lined up in parallel, to perform carrying-in or carrying-out work of the wafer between these cassettes 108 and a lock chamber 105. In addition, the atmospheric block 101 is provided with the alignment unit 107 on the housing 106 thereof, where alignment of the wafer, which is transferred from inside of this cassette 108 to the lock chamber 105, is performed.

The processing block 102 is provided with processing units 103-1, 103-2, 103-3 and 103-4, where the wafer of a sample of subject to be processed is processed in the depressurized processing chamber inside a vacuum vessel; a vacuum transfer vessel having a buffer chamber 104, which is connected to these processing units and is a vacuum transfer chamber for transferring the sample under reduced pressure; and lock chambers 105-1 and 105-2, which connect this buffer chamber 104 and atmospheric block 101. The lock chambers 105-1 and 105-2 are configured by a vessel where pressure can be increased or decreased between atmospheric pressure and the predetermined vacuum degree, by sealing in a state where the sample is stored inside. To each of processing blocks 101-1 to 101-4, the buffer chamber 104 and the lock chambers 105-1 and 105-2 of the processing block, an exhausting unit such as a turbo-molecular pump, not shown, is connected, and the inside is configured so as to be able to maintain under the predetermined pressure.

In the atmospheric block 101, after locating the cassette 108, which has been conveyed under atmospheric pressure, at any of the cassettes 108-1, 108-2 and 108-3, a wafer stored in the cassette 108 is taken out by the atmospheric transfer robot 110. The wafer taken out by the atmospheric transfer robot 110, is transferred to the alignment unit 107 (a aligning part), and after alignment of the direction and center of wafer are performed inside this alignment unit 107, the wafer is taken out again by the atmospheric transfer robot 110, to be transferred to the inside of either of the lock chambers 105-1 and 105-2.

The wafer, carried in to any one of lock chamber, for example, the lock chamber 105-1, is mounted on the sample stage arranged at the inside thereof, and then a valve for opening and closing the entrance is blocked for sealing. After a valve for opening and closing a gate of the buffer chamber 104 side is opened, in a state that pressure of the predetermined vacuum degree is maintained by reducing pressure of the inside, the wafer is delivered and mounted on the arm of a vacuum robot 109, in a state uplifted by a plurality of pin-shaped wafer pushers arranged inside the sample stage, by stretching action of the arm of the vacuum robot 109.

The vacuum robot 109 transfers the wafer to any of the processing chambers of the target processing units 103-1, 103-2, 103-3 and 103-4, where the wafer is retained on the arm and wafer processing is performed. The wafer carried-in to the processing chamber inside the target processing unit, for example, the processing unit 101-1, is delivered and mounted on the sample stage arranged at the inside of the processing chamber. After the vacuum robot 109 has retreated, the predetermined processing, for example, etching is implemented under the predetermined condition, by retaining the sample on the sample stage. These processing are performed at the inside of the sealed processing chamber.

In more specifically, the wafer transferred to the inside of the processing chamber 103-1 is mounted on the sample stage not shown. In this case, similarly as in a configuration of the inside of the lock chamber 105, a plurality of pusher pins, which are arranged inside the sample stage for ascending and descending the wafer by moving up and down, move upward, so as to mount and uplift the wafer, which is mounted on the hand at the arm tip side of the vacuum robot 109 positioned upward thereof, on the pusher pin, and then delivery of the wafer to the wafer sample stage is performed by movement of the arm to the inside of the buffer chamber 104. After movement of the arm, the pusher pin is moved downward to be stored inside the sample stage, and the wafer is mounted on the wafer mounting surface covered with a dielectric film at the upper surface of the sample stage.

After that, the processing chamber arranged at the inside of the processing unit 103-1 is arranged between the processing chamber and the buffer chamber 104, and a gate for communicating with these and a gate valve for opening and closing the passage are blocked, and the processing chamber is sealed against the buffer chamber 104. And, the inside of the processing chamber is adjusted to the predetermined pressure (vacuum pressure) by exhaustion by action of a vacuum pump arranged downward of the vacuum vessel not shown.

When attainment of sufficient vacuum degree of the inside of the processing chamber is detected, the wafer is adsorbed and retained on the wafer mounting surface at the upper surface of the dielectric film, by electrostatic chuck force between the wafer and the dielectric film, which is generated by applying power to an electrode for electrostatic chuck, arranged at the inside of the dielectric film, which is arranged at the upper surface of the sample stage, while adjusting vacuum degree to the predetermined value, by action of the vacuum pump, so as to introduce process gas to the inside of the processing chamber.

Further, gas for heat transfer of He etc. is introduced between the front surface of wafer mounting surface and the rear surface of the wafer, to adjust heat transfer between the wafer and the sample stage, so that temperature of the wafer surface is adjusted in the predetermined range. In this state, electric field or magnetic field is supplied to a space upward of the wafer inside the processing chamber, for converting the process gas to plasma, and the wafer surface is processed by using this plasma.

After completion of this processing, electrostatic chuck force is reduced by removing power applied onto the electrostatic chuck electrode, and then the pusher pin is raised again to uplift the wafer upward from the wafer mounting surface. After the gate valve sealing the processing chamber is released, the arm of the vacuum robot 109 is extended and moved, so that the hand at the tip side positions downward of the wafer. By downward movement of the pusher pin, the wafer is mounted onto the retaining surface on the hand and delivered to the arm. After that the pusher pin is stored again inside the sample stage.

In this way, after implementation of processing inside the processing units 103-1, 103-2, 103-3 and 103-4, the wafer after completion of the processing is delivered to the vacuum robot 109, and transported between the processing chambers themselves or between the processing chamber and the lock chamber 105, by combination of shrinking action of the arm of the vacuum robot 109, rotation action of the vacuum robot 109, and extending action of the arm of the vacuum robot 109.

Actions of the above vacuum robot 109 and the atmospheric transfer robot 110 are adjusted by a control unit for each, not shown. Such a control unit may be connected to the control unit, which controls total action of the vacuum chamber 100, in a receivable state of the direction, or may be integrated thereto.

In delivery or transfer of the wafer by such a vacuum robot 109, for example, there may be the case where the wafer mounted on the vacuum robot 109, whose action is controlled, or on the arm thereof, is retained at position displaced with a distance apart from the predetermined position, therefore it could not attain precise aligning and mounting at the objective position of a transfer destiny.

That is, in delivery of the wafer, there may be raised a problem of displacement generation between the wafer and the predetermined position on a hand, which has a surface for mounting and retaining the wafer at the arm of the vacuum robot 109 or the atmospheric transfer robot 110 or at the tip side thereof; or movement of position of the wafer on the robot arms or hands, during transfer. For example, even when the wafer is uplifted by a pusher pin, and the arm of the vacuum robot 109 is controlled the action, the hand at the arm tip side is arranged to the predetermined position downward the wafer, in the case where position where the wafer is mounted is different from the standard position in mounting the wafer on the arm or the hand, the above displacement could be generated.

The displacement from the standard position generates, in the case where the wafer displaces from the standard mounting position thereof in a state that the wafer is mounted on the pin on the above stage, is mounted on the arm or the hand, or is mounted on the wafer mounting surface; or by generation caused by action of vibration or inertia force during movement in a state that the wafer is mounted on the pin, arm or hand of the stage. These position displacements include displacement of center position and displacement in a specific direction which the wafer has.

Such variation of wafer position makes unstable adsorption or retaining of the wafer to the wafer mounting surface at an objective place such as the wafer stage inside the processing chamber, resulting in generation of non-uniform adsorption force to retain the wafer, or non-uniform processing, and decrease in yield of processing. In addition, the wafer can not be mounted stably on the arm or the hand in delivery thereof, resulting in dropping of the wafer during transfer, or generation of accidents or contaminations due to contact with surface of the chamber inside.

The atmospheric transfer robot 110 of the present embodiment transfers the wafer, so as not to drop the wafer during transfer, by depressurizing the clearance between the wafer and the hand, and while adsorbing the wafer and the hand by atmospheric pressure. By transfer of the wafer using vacuum adsorption force in this way, because the wafer does not move on the hand during transfer of the wafer by the atmospheric transfer robot 110, the wafer can be transferred in high speed. However, because the above adsorption force does not work under a vacuum state, a wafer transfer robot of a vacuum adsorption-system cannot be used. Therefore, the vacuum robot 109 mounts the wafer on the upper surface of the hand, has a protruded part at the peripheral part of the wafer installment surface at the upper surface of the hand, and has a structure where position of the wafer is controlled inside the protruded part.

When the vacuum robot 109 receives the wafer from the above lock chamber, the wafer mounted on the sample stage in the lock chamber is uplifted by the pusher or the like, and after the hand of the vacuum robot 109 is inserted Between the sample stage and the wafer, by pulling down of the pusher, the wafer is delivered onto the above hand.

In this case, when the inner side of the above protruded part of the upper surface of the hand has taper-shape, and the wafer is delivered from the above lock chamber to the hand, and even when the wafer position is displaced from the sample installment position of the upper part of the hand, the wafer can be stored at the inside of the above protruded part by slipping down the wafer at the above taper-shaped part, as long as the wafer position is stored inside of the taper-shaped part of the above protruded part.

When the vacuum robot 109 receives the wafer from the block chamber 105, in the case where position displacement of the wafer and the hand is larger than the above allowable displacement amount, there is risk of failure in wafer delivery, or drop of the wafer during transfer, because the wafer does not enter inside the protruded part of the upper surface of the hand.

Here, a sample installment surface, which is present inside the protruded part of the above hand, can move slightly in a horizontal direction at the upper surface of the hand. In this way, free movement of the wafer on the hand decreases wafer transfer precision.

Therefore, in delivery of the wafer from the lock chamber 105 to the hand of the vacuum robot 109, when area of the sample installment surface at the upper surface of the hand is increased, so that the allowable displacement amount of positions of the wafer and the hand is increased, sample movement amount at the upper surface of the hand becomes large and transfer precision decreases, while when a hand having small sample transfer amount at the sample installment surface of the vacuum robot 109 is used to enhance transfer precision, the allowable displacement amount of positions of the wafer and the hand becomes small, when the vacuum robot 109 receives the wafer from the lock chamber 105.

Low transfer precision of the wafer by the vacuum robot 109 gives a bad effect to processing performance in processing the wafer inside the processing chamber. It is required, in order to suppress this, that positions of the wafer and the hand are arranged in high precision to the delivery position of the sample, so as to succeed sure delivery, even when allowable displacement value of positions of the wafer and the hand is small, in receiving the sample by the vacuum robot 109 in the lock chambers 105-1 and 105-2.

At the inside of the cassette 108, position of the sample is not determined in high precision. When the wafer of the atmospheric transfer robot 110 transfers the wafer from the cassette 108 to the lock chamber 105, there is generated displacement of sample transfer position relative to target transfer position by each wafer. Therefore, when the vacuum robot 109 receives the wafer from the lock chamber 105, if the above allowable displacement amount of the robot hand and the sample position is small, there may be unsuccessful wafer delivery.

Therefore, usually, when the atmospheric transfer robot 110 transfers the sample from the cassette 108 to the lock chamber 105, the wafer stored in the cassette 108 is transferred to the alignment unit 107 by the atmospheric transfer robot 110, and after performing correction of wafer eccentricity and alignment of the specific notched part (V notch), the atmospheric transfer robot 110 transfers the wafer again to the lock chamber 105. By this, the wafer can be transferred to the target position in high precision. On the other hand, longer transfer time is required, because wafer is transferred to the lock chamber 105 via the alignment unit 107, to transfer in high precision to the center of the sample stage of the inside of the processing chamber of any of the processing units 103-1 to 103-4.

Figure 3:
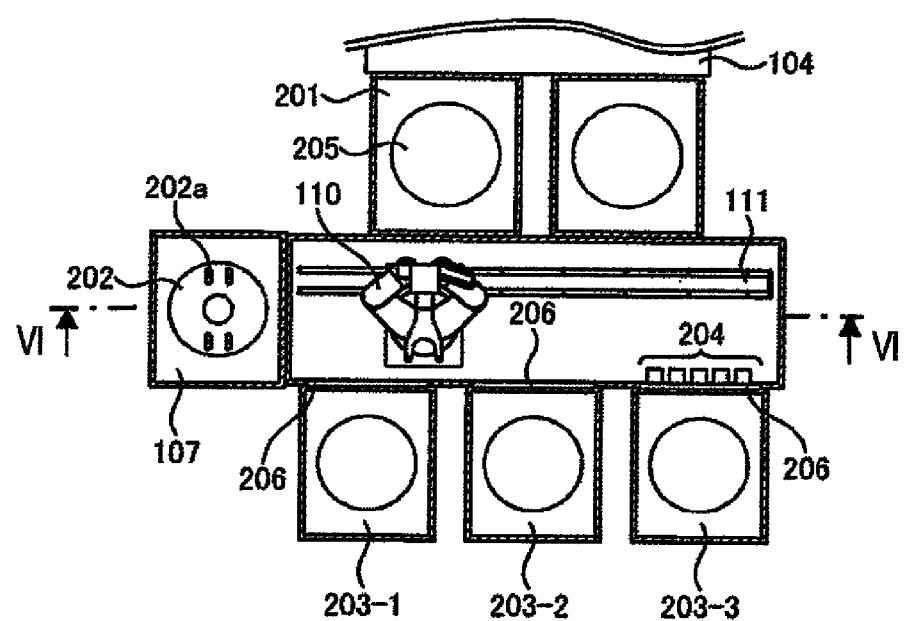
FIG. 3 is a drawing for explaining in more detail a configuration of the atmospheric block of the embodiment shown in FIG. 1.
Figure 4:
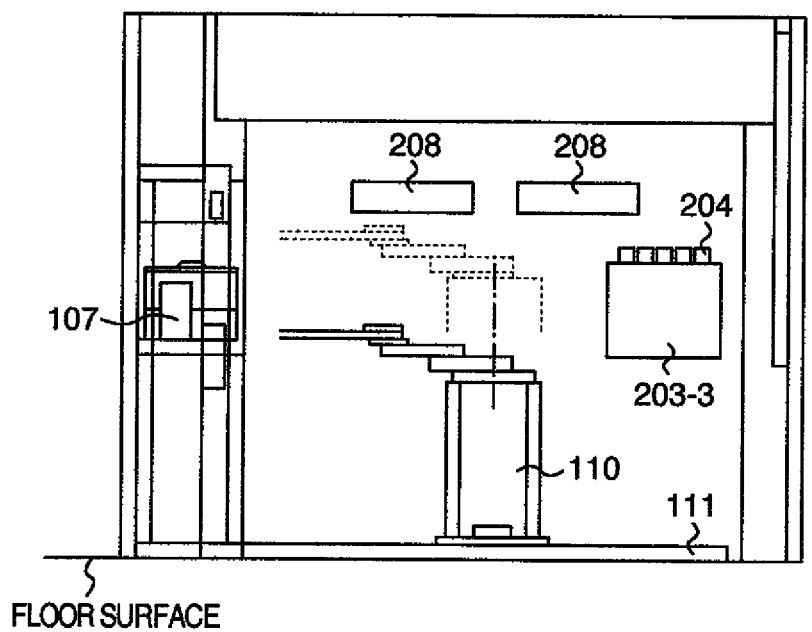
FIG. 4 is a front view of the atmospheric block of the embodiment shown in FIG. 3.

Next, explanation will be given in detail on alignment of the wafer of the present embodiment with reference to FIGS. 3 and 4. FIG. 3 is a top cross-sectional view showing a detailed configuration of the atmospheric block of the embodiment shown in FIG. 1. FIG. 4 is a front view of the atmospheric block of the embodiment shown in FIG. 3, in particular, a drawing showing cross-section along the broken line VI-VI of FIG. 3.

In the present drawing, the atmospheric block 101 is mounted with cassettes 203-1, 203-2 and 203-3 storing a plurality of wafers at the inside thereof, at the upper surface of a plurality of cassette stages 108-1, 108-2 and 108-3, which are arranged at the front surface side of the housing 106 thereof. In addition, at the front surface of the housing 106, and between the rear part opening of each of the cassettes 203-1 to 203-3, there is arranged a load port 206, which is arranged with a detector 204 for opening and closing an opening for exchanging the internal wafer, as well as for adjusting loading and unloading action of the wafers from these cassettes 203-1 to 203-3.

In addition, in the back surface (upward in the drawing) of the housing 106, there is arranged the lock chambers 105-1 and 105-2, where wafer delivery is performed between the atmospheric transfer robot 110 and the vacuum robot 109, in a pressurized or depressurized state at the inside thereof, and it is partitioned by a gate valve for sealing by opening and closing between the atmospheric transfer chamber of the inside of the housing 106. Explanation will be given in FIG. 3 and FIG. 4, by attaching a code 201 to the lock chamber 105-1 of FIG. 1.

The atmospheric transfer robot 110 is configured by a hand, a multiple joints arm and an actuator provided with a light shielding sensor to be described later. In addition, at the left end part of FIG. 1 of the housing 106, there is arranged the alignment unit 107 for receiving the wafer from the atmospheric transfer robot 110, which transfers the wafer among the cassettes 203-1 to 203-3 in communication with the atmospheric transfer chamber inside the housing 106, and performing alignment in the case where amount of eccentricity of the wafer is larger than the predetermined value.

The wafer stored in any one of the cassettes 203-1 to 203-3 is carried in to the inside of the atmospheric transfer chamber by retaining and taking out onto the arm thereof, by the atmospheric transfer robot 110, which moves on a rail 111 and the z-axis. In this case, there are detected information on position of the specific part (for example, the notched part, the V-notch or the like) of the wafer obtained by using output result from the sensor arranged on the hand, which mounts and retains the wafer at the upper surface at the arm tip part, and eccentricity amount of the wafer obtained by using output result from the detector 204, which is attached at the load port 206.

The detector 204 is configured by a plurality of optical sensors, composed of a pair of a light emission part and a light receiving part, arranged in parallel in a left and right direction (a horizontal direction) in the drawing, at the upward of the upper end part of an opening, which opens and closes to transfer and pass through the wafer of the load port 206. These optical sensors are arranged in a row-state at the predetermined height position from the upper surface of the cassettes 203-1 to 203-3, corresponding to each of the load port 206.

Light from the emission part of these detectors 204 is reflected at the wafer surface and received by the light receiving part. Light intensity or time between light emission and light reception, detected by each sensor row, is detected by a control unit not shown, and distance between the wafers and the row of the detector 204 (That is, distance from the upper surface of any of the cassettes 203-1 to 203-3), or distance from the arm of the atmospheric transfer robot 110 is detected. By continuously detecting these in small cycle sufficient to the wafer moving at the downward of the row of the detector 204, wafer shape at the downward of the sensor, or shape and position of the arm is detected. At the control unit, by using this detection result, position of the notched part (V-notched part) of the wafer, relative to the standard position of the hand, is detected.

In the present embodiment, by using information on size of eccentricity of the wafer, and position of the notched part of the wafer detected, amount of eccentricity and position of the notched part of the wafer are calculated in the control unit not shown, by using a computing unit arranged inside. Amount of eccentricity is detected from size and direction of displacement from the standard position (for example, center position of the wafer in a state that the wafer is mounted on the hand) of the arm. In addition, position of the notched part or V-notch is detected from direction (for example, angle relating to an axis direction as standard of the hand or the arm) to the practical center of the wafer mounted. The relevant computing unit may be one connected to the control unit at a remote place in a state enable to communicate.

In this case, the control unit compares amount of eccentricity of the wafer calculated above with the size of the set value in advance (allowable value) recorded in a memory unit arranged inside the control unit, and performs judgment whether it is within the relevant allowable value. In the case where it is judged to be within the above allowable value of the wafer, in a state mounted on the hand, the atmospheric transfer robot 110 adjusts rotation of a plurality of joint parts connected to a plurality of arms thereof, so that the center of the circular mounting surface of the sample stage 205, arranged inside of the lock chamber 2-1, is coincident with the practical center of the wafer retained on the arm, and delivers the wafer at the upper part of the sample stage 205.

Further, the control unit performs alignment, by adjusting drive of a plurality of joint parts of the above plurality of arms, so that position (direction relative to the practical center of the wafer) of the notched part of the wafer calculated above coincides with the standard position (direction) of the notched part in a mounted state, in coincident with the standard position of the center position of the wafer on the sample stage 205, and by turning and rotating the wafer around the center thereof.

The atmospheric transfer robot 110 of the present embodiment is connected by joints which are capable of adjusting a plurality of rotation amounts at the end parts thereof, so that a plurality of arms thereof are capable of correcting or eliminating amount of eccentricity of the wafer mounted, or rotating and turning around the wafer center. In addition, an actuator of the Z-axis, which is capable of making the arm moved in an up and down direction, may be connected to the joints.

The above value is determined in advance, in response to dimension, such as distance between a gate, through which the wafer mounted on the arm passes inside by communicating with the lock chamber 201 and the inside of the housing 106, and the arm or hand of the atmospheric transfer robot 110 or the wafer, or clearance between this arm or hand and the pin supporting the wafer at the upper surface of the sample stage, in a state that the arm has entered inside the lock chamber 201.

For example, in the case where the arm is moved to correct eccentricity of the wafer, movable size is limited within a range of clearance between the external circumference end of the wafer and the inner wall of the lock chamber 201, or clearance in horizontal directions of the hand and the pin. The case of the movement over this range incurs collision of the wafer or the arm or the hand, resulting in generation of dust or contamination or further eccentricity. To correct so as not generate such troubles, an operable arm drive range is memorized, in advance, inside of the memory unit of the above control unit.

In the case where size of displacement of the amount of eccentricity of the wafer or the standard position of the notched part is judged to be outside of the allowable value, alignment of the wafer is performed by the alignment unit 107 arranged at the left end part (position at the height of the left end middle stage of the inside) in the drawing of the housing 106. The alignment is performed after the wafer is delivered from the atmospheric transfer robot 110 to the sample stage 202 at the inside of the alignment unit 107.

The alignment unit 107 has the sample stage 202, inside a vessel which has nearly rectangular shape, and is arranged with an opening with a size capable of loading and unloading the wafer at the right side on the drawing. The sample stage 202 has a cylinder-shaped mounting part, and is configured so as to be capable of rotating around an axis, which is arranged at the center part of the mounting part and is present extended in an up and down direction. In addition, at the vicinity (at the side part of the forward side in the drawing) of the sample stage 202, there is arranged the sensor 207, which is capable of optically detecting position of outer edge of the wafer mounted on the sample stage 202, and presence or absence or intensity of light passage by movement of the notched part in a circumference direction, accompanying with rotation of the mounting part, is detected and by using this information, position of the notched part is detected in the control unit.

In addition, at the upper surface of the circular-shaped mounting part, there is provided a plurality of pins 202a, which are movable up and down, arranged each symmetrically to two axes vertical to the above center axis, and these pins are configured, in a protruded state of the tip upward of the mounting part, so as to be movable along a direction of at least one axis among the above axes. In the present embodiment, four pins are provided and they are configured so as to be movable along an up and down direction (front and back direction) in the drawing.

In the present embodiment, in the case where amount of eccentricity is judged to be over the allowable value, and displacement of position of the notched part is within the allowable range, and alignment of the wafer is performed using the above alignment unit 107, the atmospheric transfer robot 110 receives a directive signal from the control unit, and delivers the wafer by retaining on the arm hand, and mounting at position where eccentricity is correctable on the mounting part of the sample stage 202 of the alignment unit 107.

That is, after delivery of the wafer mounted on the above pin in a state that the tip is protruded upward on the mounting part of the sample stage 202, the wafer is retained on the mounting part. In this delivery, in the present embodiment, the atmospheric transfer robot 110 makes rotated and driven a plurality of arms and a plurality of joint parts connecting these, so as to make standard wafer center position for retaining the wafer on the hand coincident with center position of the mounting part. Further, the alignment unit 107 adjusts the axis along a movement direction of a plurality of pins arranged symmetrically as above, to a direction of eccentricity of the wafer, that is, along a direction of a line connecting the practical center and the standard center position, by rotating the mounting part thereof around the center axis. It should be noted that this rotation may be performed in a state that the hand of the atmospheric transfer robot 110 is positioned between the wafers on the mounting part. In this case, the hand retaining the wafer is provided with an opening at the center part thereof as will be described later, so as not to inhibit of not to collide with moving pins by rotation.

After completion of rotation of the mounting part, the wafer is moved downward by action of the atmospheric transfer robot 110, and mounted on at least three pin tips protruded upward of the upper surface of the mounting part. In this state, relative position (distance and direction) of the practical center of the wafer and the center axis of the mounting stage is nearly coincident with relative position of the practical center position of the wafer on the hand and the standard center position, that is, amount of eccentricity. Then, in response to a directive from the control unit, a plurality of pins of the mounting part is driven to make the practical center of the wafer coincident with the center axis.

In this case, even in the case where the wafer mounted is rotated around the rotation axis, distance from the center axis of the notched part is made to have extremely small variation in response to rotation angle. After this, by action of the arm of the atmospheric transfer robot 110, the wafer is mounted on the hand by making the center position coincident with the standard position and delivered.

In addition, in the case where amount of eccentricity of the wafer detected is within the allowable range, and displacement of position of the notched part is over the allowable value, the atmospheric transfer robot 110 mounts the wafer on the arm hand and delivers the wafer onto the mounting part, so that position of the wafer center is coincident with the position of the center axis of the mounting part. After the arm has degenerated from the upper part of the mounting part, the mounting part rotates, so that position of the notched part is within the allowable range, and rotates the wafer to correct it.

In this case, before correcting position of the notched part or the V notched part, by rotating the wafer, and by passing the notched part or the V notched part though a place, where the sensor 207 is arranged, relative position to the standard position of the alignment unit 107 on the mounting part, is detected. Position, where the sensor 207 is installed, has been obtained in advance, and the notched part or the V notched part detected here is present at the same position or at the vicinity of the sensor 207. The wafer is rotated from here to make the notched part or V notched part coincident to position within the allowable range relative to the standard position for the mounting part.

After stopping of rotation of this wafer, the atmospheric transfer robot 110 extends the arm and makes the hand entered between the wafer and the mounting part to receive the wafer on the sample stage 202. In this case, the atmospheric transfer robot 110 receives a directive from the control unit, so as to make the standard position of the hand coincident with the standard position of the wafer, and adjusts drive of the arm and the joint part of the end part thereof. In a state that the wafer is retained on the hand, the center position of the wafer and position of the notched part are made to have displacement from the standard position sufficiently small within the allowable range.

After this, by degeneration of the arm of the atmospheric transfer robot 110 again, the wafer is transferred into the lock chamber 201 via the gate valve 208 between the atmospheric transfer chamber of the inside of the housing 106 and the lock chamber 201. On the other hand, in the case where amount of eccentricity of the wafer mounted on the hand and displacement of position of the notched part are judged to be within the allowable range by the control unit, the wafer is transferred to the lock chamber 201 after passing through the load port 206 without via the alignment unit 107, and thus transfer time is shortened. In addition, in the case where displacement amount of position of the wafer is larger than the predetermined value, by performing alignment of the wafer by the alignment unit 107, transfer error can be prevented and the wafer can be transferred surely.

Figure 5:
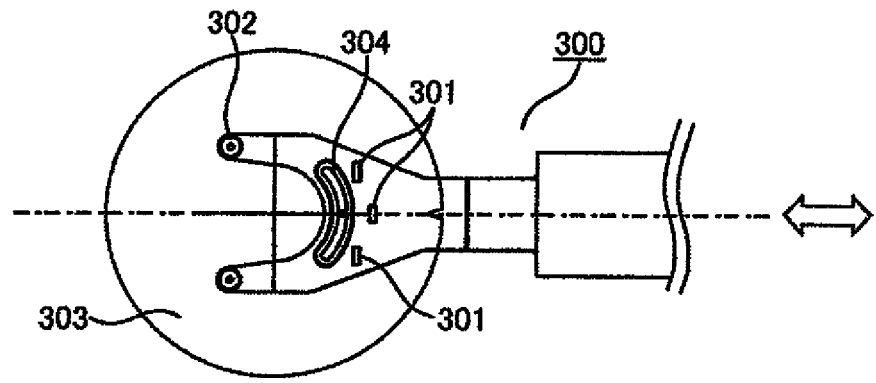
FIG. 5 is a top view showing a configuration of a hand of the arm tip part of an atmospheric transfer robot relevant to the embodiment shown in FIG. 1.

FIG. 5 is a top view showing a configuration of a hand of the arm tip part of the atmospheric transfer robot shown in FIG. 1. On the surface where the wafer 303 of the hand 300 shown in this drawing is mounted, an optical sensor 301 is arranged, and with movement, which the hand 300 conducts to the wafer 303 in delivery of the wafer 303, shape of the wafer 303 and position thereof are detected, from the output detected influence caused by shielding of light reception by the optical sensor 301 or intensity variation by the wafer 303.

In this drawing, the hand 300 is present extending in a direction of the left and right axis on the drawing, and branches to a plurality of beam-like parts from the midway toward the left end part, viewed from the root of the right end part to the tip part of the left side. These branched parts have flat upper surface, and the wafer 303 is mounted and retained thereon. The above axis in a left and right direction is an axis in a front and back direction of the arm of the hand 300 along an extending and degenerating direction thereof, and the hand 300 is provided with bilaterally symmetric shape about this axis including the optical sensor 301, viewed from top.

The wafer 303 is retained on the upper surface of at least three places: upper surfaces of two beams (arms) arranged at both sides of the above front and back axis of the tip side of this hand 300, and the root of these arms. In addition, position, where the wafer 303 is mounted, so that center of the wafer 303 and center of the notched part are positioned on the front and back axis between the two beam-like parts (arms) of the hand 300, becomes the standard position on the hand 300. It should be noted that, as for the wafer 303 on the drawing, a mounted state at the standard position on the hand 300 is shown as a broken line, that is, overlapped position of the notched part of the wafer 303 and the center on the axis.

In addition, at the three places of the tip parts of the two arms and the root part, there are arranged recesses 302, 302' and 304, and an opening for exhausting a space inside these recesses. In a state that the wafer 303 is mounted on the hand 300, by making the outer circumference part, which is raised higher than the inner part of these recesses, abutted to the rear surface of the wafer 303, and decompressed by exhaustion of the space formed inside from the above opening, the wafer 303 is adsorbed onto the upper surface of the hand 300, and retained thereto.

In transfer of the wafer 303, the hand 300 enters the space at the rear surface side (lower side) of the wafer 303. With relative movement to the wafer 303 in entering of this hand 300, light beam is irradiated toward the rear surface of the wafer 303, from the optical sensor 301 arranged on the front and back axis, and at bilaterally symmetric position thereof. The optical sensor 301 detects reflection of light irradiated continuously with relative movement.

The control unit, which received detection result from the optical sensor 301, detects time or hour when light is shielded by the wafer 303, with movement of the hand 300 in taking out the wafer 303, and calculates shape and position of the wafer 303, relative to the standard position of the hand 300, under set condition of wafer transfer speed of the hand 300 or the atmospheric transfer robot 110 mounting this. This calculation result includes displacement from the standard position, for example, shape of the notched part, and position thereof relative to the wafer center.

In the present embodiment, three optical sensors 301 are arrange on the hand 300, to enhance measurement precision. As described above, they are arranged at symmetric position for the front and back axis as the standard of the hand 300, and any of these is arranged by having the predetermined width, and as for an axis direction, in a direction to traverse this vertically or in a range viewable to be vertically.

Each optical sensor 301 may be provided with a configuration of what is called a line sensor, where not only a single pair of a light emission part and a light receiving part, but also a plurality of pairs is arranged as a row in the above direction. It should be noted that in the center optical sensor 301, width arranged with the above detection part is made larger than width of the notched part of the wafer 303, and by this arrangement, shape of the notched part of the wafer 303 is detected, as well as center of the wafer 303, which was detected along with output result from other optical sensor 301, and position of the notched part relative to the standard position of the hand 300, are calculated.

Movement speed of the hand 300 detected or set in advance, and relative position of each of the optical sensor 301 to the standard position of the transfer hand 300 of the arm of the atmospheric transfer robot 110, are recorded inside the control unit not shown, or inside the recording medium of the recording device connected therewith in a communication possible state, and stored in a readable state, if necessary. By using information thus read out, shape of the wafer 303, such as position of the notched part, is detected.

In the present embodiment, the optical sensor 301 to be used for detecting the notched part of the wafer 303 is arranged on the hand 300, however, detection means for detecting the notched part and arrangement thereof are not limited to the present embodiment, and means for detecting sound wave or contact may be used, and arrangement place may be arranged at the cassette 108 or the load port 206. In addition, amount of eccentricity of the wafer 303 is detected using output from the detector 204 at the upward of the load port 206, and position of the notched part of the wafer 303 is detected using output from the optical sensor 301 arranged on the upper surface of the hand 300, however, information on position of the notched part of the wafer 303 may be detected using a sensor arranged at the load port 206 side (housing 106), or information on amount of eccentricity of the wafer 303 may be detected by a sensor arranged at the hand 300 or the atmospheric transfer robot 110.

Figure 6:
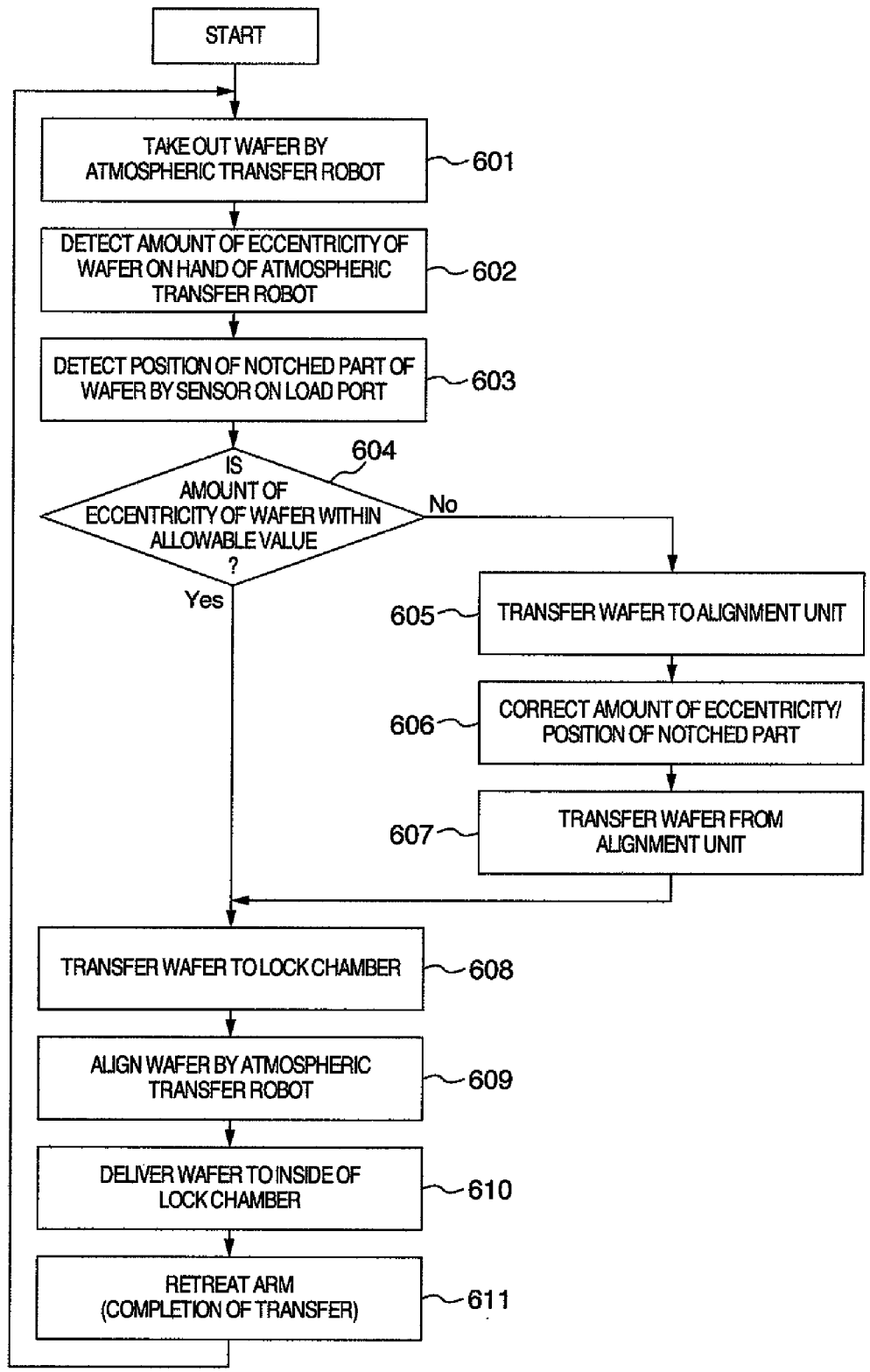
FIG. 6 is a drawing showing a wafer transfer motion flow of the vacuum chamber relevant to the embodiment shown in FIG. 1.

FIG. 6 is a drawing showing a wafer transfer motion flow of the vacuum chamber relevant to the embodiment shown in FIG. 1. In particular, a motion flow in transfer inside the atmospheric transfer chamber inside the housing 106 of the vacuum chamber 100 of the present embodiment is shown as a flow chart.

In the flow chart shown in FIG. 6, action of the atmospheric transfer robot 110 is started by transmitting transfer directive for carrying-out any of the wafer stored inside the cassette 108 and carrying in to either of the lock chambers 105-1 and 105-2 from the control unit to the atmospheric transfer robot 110. In the step 601, the wafer is delivered on the hand, when the arm of the atmospheric transfer robot 110 is driven through the opening of the load port 206, and the hand enters inside the cassette 108.

In this case, information on wafer position, for example, amount of eccentricity, is detected by a sensor arranged on the hand, with entering downward of the wafer, of the hand of the atmospheric transfer robot 110 and retention action of the wafer (step 602). Next, the wafer is mounted on the hand and taken out from the cassette 108, and carried in to the inside of the atmospheric transfer chamber inside the housing 106 through the opening of the load port 206. In this case, position of the notched part is detected by using output of detection from the detector 204 upward of the opening of the load port 206 (step 603).

Next, in the step 604, information on position and displacement amount, obtained in the steps 602 and 603, and information on the predetermined value read out from the memory unit are compared to judge whether any of displacement amount of eccentricity of the wafer or position of the notched part is within the allowable range or not. In the case where at least any of these amounts is outside the allowable range, the wafer is transferred to the alignment unit 107 (step 605), by driving the atmospheric transfer robot 110 in response to a directive signal from the control unit, to perform correction of amount of eccentricity of the wafer or alignment of the notched part of the wafer (step 606).

In the case where eccentricity of the wafer or position of the notched part is corrected and all of these are judged to be within the predetermined values, through the steps 605 and the step 606, the atmospheric transfer robot 110, in the step 607, carries-out the wafer from the alignment unit 107 to the atmospheric transfer chamber (step 607) and the process goes to the step 608. On the other hand, in the step 604, in the case where eccentricity of the wafer and displacement amount are judged to be within the predetermined value, the process goes to the step 608.

In the step 608, the wafer is transferred toward any of the lock chambers 105-1 and 105-2, and center of the wafer and position of the notched part are made coincident with the standard position (for example, position where the notched part is just in front of the gate opening, by making the sample stage coincident with the center position of the wafer) on the sample stage arranged inside of any of the lock chambers 105-1 and 105-2, by the atmospheric transfer robot 110, in the step 609. Next, when delivery of the wafer is implemented in the step 610, the arm degenerates in response to a directive signal from the control unit, to block the gate valve of the target lock chamber, and wafer transfer is completed (step 611).

In the motion flow of FIG. 6, judgment is performed by the step 604 on whether value is within the allowable range, and the allowable value is set at the optimal predetermined value, so that wafer transfer action is performed quickly and surely in the vacuum chamber. As described above, according to the present embodiment, in wafer transfer, in particular, in taking out, shape of the wafer and displacement amount of position are detected, and in response to this detection result, requirement of correction thereafter is judged to select a transfer route. For example, in the case where the detected result is judged to be equal to or smaller than the predetermined value, the wafer of a target is directly transferred inside the lock chamber. Therefore, transfer time of the wafer from the cassette to the lock chamber is shortened.

On the other hand, in the case where performance of any of the correction is judged necessary, the wafer is transferred to the alignment unit and receives correction. In the alignment unit, at least any of the amount of eccentricity or displacement of position of the notched part is corrected, however, because amount of work required for the correction has been reduced, time required to transfer the wafer from the cassette to the lock chamber is shortened.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus comprising:
   a vacuum vessel arranged at a backward side, where a wafer is processed in a processing chamber disposed inside said vacuum vessel;
   a transfer chamber arranged at a forward side, where said wafer is transferred inside thereof under atmospheric pressure;
   a cassette stage arranged in front of said transfer chamber, on the cassette stage a cassette which stores said wafer therein being mounted;
   a lock chamber communicating with said transfer chamber at the backward side of said transfer chamber, said lock chamber being arranged between said transfer chamber and said vacuum vessel;
   a robot which is arranged inside said transfer chamber and transfers said wafer between said cassette and said lock chamber, said robot being equipped with both an arm which can rotate, expand and contract in a given direction, and a hand which can hold said wafer on an upper surface thereof;
   an aligning unit which makes a position of said wafer fit with a predetermined position, said aligning unit being in communication with said transfer chamber; and
   a control unit which detects said position of said wafer with respect to said robot using an output of a detector disposed on said hand of said robot, said output being obtained while said wafer is transferred from said cassette to the inside of said transfer chamber by said expansion or contraction of said arm of said robot,
   wherein said control unit controls transferring of said wafer by said robot so that said wafer is transferred to said lock chamber after alignment of said wafer on said aligning unit, in a case where a displacement amount of position of this wafer from a reference position is larger than a predetermined value, and
   wherein said control unit controls transferring of said wafer by said robot so that said wafer is transferred to said lock chamber without performing alignment of said wafer on said aligning unit in a case where said displacement amount of position of this wafer is equal to or smaller than the predetermined value.

2. The vacuum processing apparatus according to claim 1, wherein said robot corrects said displacement amount of position before mounting said wafer on a stage inside said lock chamber, in the case where the displacement amount of position is equal to or smaller than said predetermined value.

3. The vacuum processing apparatus according to claim 1, wherein said control unit detects displacements of position of a notched portion and a center position of said wafer, and said aligning unit corrects at least any one of the displacement amounts of these positions.

4. The vacuum processing apparatus according to claim 1, wherein said robot performs a correction of said displacement amounts of position of said wafer before said robot locates said wafer on said alignment unit.

5. The vacuum processing apparatus according to claim 2, wherein said control unit detects displacements of position of a notched portion and a center position of said wafer, and said aligning unit corrects at least any one of the displacement amounts of these positions.

6. The vacuum processing apparatus according to claim 2, wherein said robot performs a correction of said displacement amounts of position of said wafer before said robot locates said wafer on said alignment unit.

* * * * *